(12) United States Patent
Choi et al.

(10) Patent No.: US 7,387,508 B2
(45) Date of Patent: Jun. 17, 2008

(54) COMPLIANT DEVICE FOR NANO-SCALE MANUFACTURING

(75) Inventors: Byung-Jin Choi, Austn, TX (US); Sidigata V. Sreenivasan, Austin, TX (US)

(73) Assignee: Molecular Imprints Inc., Austin, TX (US)

( * ) Notice: Subject to any disclaimer, the term of this patent is extended or adjusted under 35 U.S.C. 154(b) by 290 days.

(21) Appl. No.: 11/142,838

(22) Filed: Jun. 1, 2005

(65) Prior Publication Data

US 2005/0275251 A1    Dec. 15, 2005

Related U.S. Application Data

(60) Continuation-in-part of application No. 10/858,179, filed on Jun. 1, 2004, now abandoned, which is a division of application No. 11/142,825, filed on Jun. 1, 2005.

(51) Int. Cl.
*B29C 59/02* (2006.01)

(52) U.S. Cl. .................. 425/385; 33/644; 310/323.17; 977/887

(58) Field of Classification Search ................. 425/385; 977/887; 101/130; 310/323.17, 311, 328; 318/34; 33/644
See application file for complete search history.

(56) References Cited

U.S. PATENT DOCUMENTS

| 5,740,699 | A | 4/1998 | Ballantyne et al. |
| 6,873,087 | B1 * | 3/2005 | Choi et al. ............. 310/323.17 |
| 6,922,906 | B2 * | 8/2005 | Choi et al. .................... 33/613 |
| 7,098,572 | B2 * | 8/2006 | Choi et al. ................... 310/311 |

\* cited by examiner

*Primary Examiner*—Yogendra Gupta
*Assistant Examiner*—Emmanuel S Luk
(74) *Attorney, Agent, or Firm*—Michael D. Carter; Fish & Richardson P.C.

(57) ABSTRACT

The present invention is directed to a compliant device comprising a support body, a floating body, and a plurality of flexure arms. Each of the plurality of flexure arms is connected between the support body and the floating body to transfer a load therebetween in parallel. To that end, the flexure arms have first and second sets of flexure joints. The first set of flexure joints facilitate rotational movement of said flexure arm about a first axis extending along a first direction. The second set of flexure joints are arranged to facilitate rotational movement of the flexure arm about a second axis, extending along a second direction that is transverse to the first direction. The flexure joints are resolute joints.

11 Claims, 9 Drawing Sheets

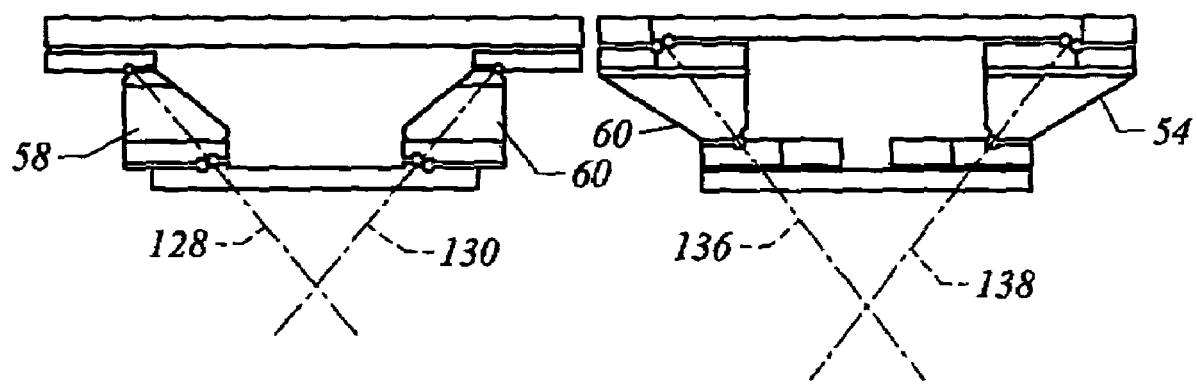

COMPLIANT DEVICE FOR NANO-SCALE MANUFACTURING

CROSS-REFERENCE TO RELATED APPLICATIONS

The present application is a continuation-in-part of U.S. application Ser. No. 10/858,179, filed on Jun. 1, 2004, now abandoned entitled "Compliant Device for Nano-Scale Manufacturing," listing Byung-Jin choi and Sidigata V. Sreenivasan as inventors, and a divisional of U.S. application Ser. No. 11/142,825, filed Jun. 1, 2005, entitled "Method and System to Control Movement of a Body for Nano-Scale Manufacturing," listing Byung-Jin Choi choi and Sidigata V. Sreenivasan as inventors.

BACKGROUND OF THE INVENTION

The field of invention relates generally to remote center compliant devices. More particularly, the present invention is directed to a compliant device suited for use in imprint lithography to hold a template.

Compliant devices are devices that have elastic properties to compliantly float one body relative to another, while providing a desired number of degrees of freedom of movement therebetween. These properties permit, inter alia, the floating body to compensate out-of-tolerance spatial orientations with respect to a work surface. Active compliant devices use actuators to achieve a desired spatial orientation between bodies. "Passive" compliant devices are unpowered, i.e., without active control. Being able to be kinematically constrained in any translational or rotational direction, a "passive" compliant device achieves proper spatial orientation between the floating body and a work piece through interconnecting linkages and passive elastic elements, e.g., springs. Actuation of the compliance function occurs upon contact of the floating body with the work surface. To that end, forces transferred between the floating body and a support body coupled thereto via linkages may be achieved serially or in parallel.

An exemplary compliant device is shown in U.S. Pat. No. 6,696,220 to Bailey et al. that discloses a remote passive compliant device for use in imprint lithography. The remote passive compliant device facilitates a transfer of forces between the floating body and a support body coupled thereto serially, through a plurality ot linkages. The linkages are coupled between the floating body and the support via flexure joints. With this configuration, proper spatial orientation between an imprint lithography template and imprinting material of a work surface may be achieved.

Thus, a need exists for providing improved compliant devices for use in imprint lithorgraphy processes.

SUMMARY OF THE INVENTION

The present invention is directed to a compliant device comprising a support body, a floating body, and a plurality of flexure arms. Each of the plurality of transfer arms is connected between the support body and the floating body to transfer a load therebetween in parallel. To that end, the flexure arms have first and second sets of flexure joints. The first set of flexure joints facilitate rotational movement of the flexure arm about a first axis extending along a first direction. The second set of flexure joints are arranged to facilitate rotational movement of the flexure arm about a second axis, extending along a second direction that is transverse to the first direction. The flexure joints are resolute joints. Thus, the movement of the flexure arms is constrained to rotational movement about two transversely orientated axes. In one embodiment the compliant device is a passive compliant device. In an alternate embodiment, the compliant device is an active compliant device. These and other embodiments are discussed more fully below.

BRIEF DESCRIPTION OF THE DRAWINGS

FIG. 8 is a side view of the compliant device, shown in FIG. 6, rotated 180 degrees;

FIG. 9 is a side view of the compliant device, shown in FIG. 6, rotated 270 degrees.

DETAILED DESCRIPTION OF THE INVENTION

Figure 1:
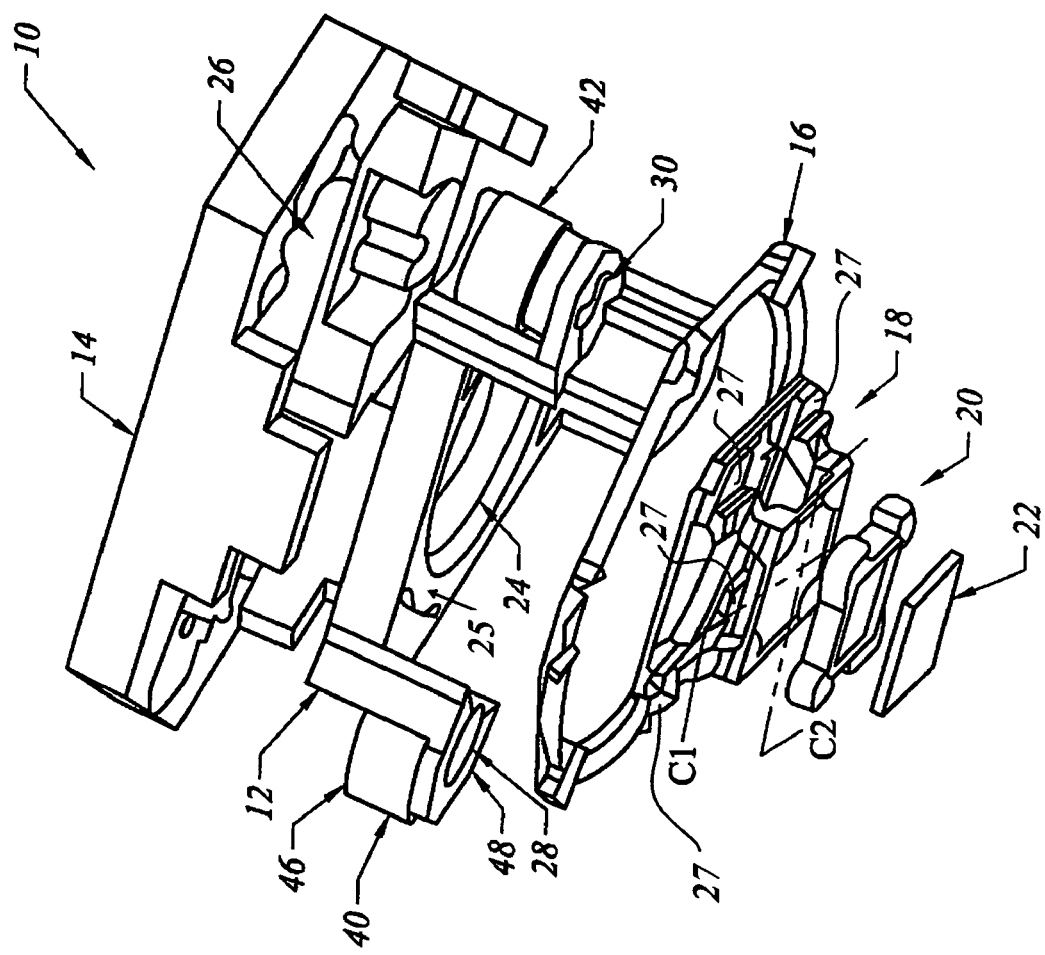
FIG. 1 is an exploded perspective view of an orientation stage showing a template chuck and a template in accordance with the present invention.

Referring to FIG. 1, an orientation stage 10 is shown having an inner frame 12 disposed proximate to an outer frame 14, a flexure ring 16 and a compliant device 18. Compliant device 18 is discussed more fully below. The components of orientation stage 10 may be formed from any suitable material, e.g., aluminum, stainless steel and the like and may be coupled together using any suitable means, such as threaded fasteners (not shown). A template chuck 20 is coupled to orientation stage 10, shown more clearly in FIG. 2. Specifically, template chuck 20 is coupled to compliant device 18. Template chuck 20 is configured to support a template 22, shown in FIG. 1. An exemplary template chuck is disclosed in United States patent publication No. 2004/0090611 entitled "Chuck System for Modulating Shapes of Substrate," assigned to the assignee of the present invention and is incorporated by reference herein. Template chuck 20 is coupled to compliant device 18 using any suitable means, such as threaded fasteners (not shown) coupling the four corners of template chuck 20 to the four corners of compliant device 18 position proximate thereto.

Figure 2:
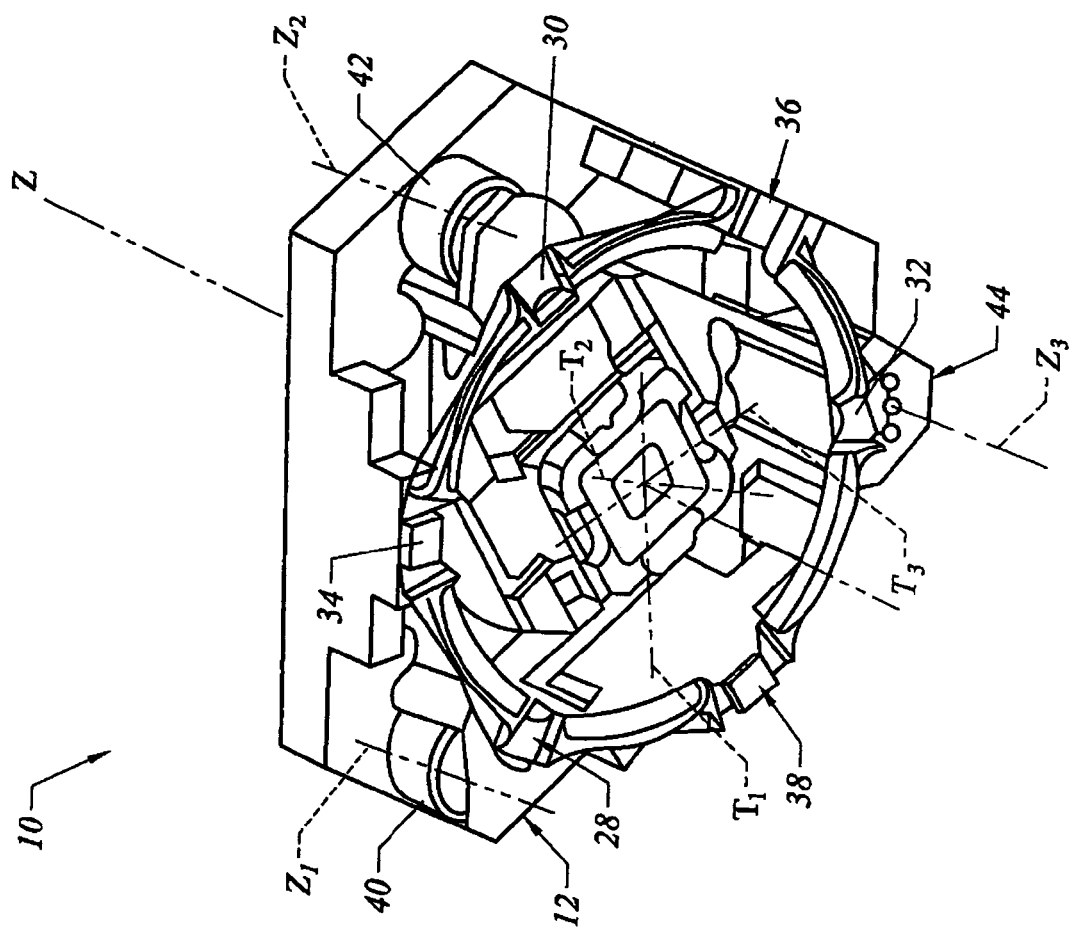
FIG. 2 is perspective view of the orientation stage shown in FIG. 1.

Referring to FIGS. 1 and 2, inner frame 12 has a central throughway 24 surrounded by a surface 25, and outer frame 14 has a central opening 26 in superimposition with central throughway 24. Flexure ring 16 has an annular shape, .g., circular or elliptical, and is coupled to inner frame 12 and outer frame 14 and lies outside of both central throughway 24 and central opening 26. Specifically, flexure ring 16 is coupled to inner frame 12 at regions 28, 30, and 32 and outer frame 14 at regions 34, 36, and 38. Region 34 is disposed between regions 28 and 30 and disposed equidistant therefrom; region 36 is disposed between regions 30 and 32 and disposed equidistant therefrom; and region 38 is disposed between regions 28 and 32 and disposed equidistant therefrom. In this manner, flexure ring 16 surrounds compliant device 18, template chuck 20, and template 22 and fixedly attaches inner frame 12 to outer frame 14. Four corners 27 of compliant device 18 are attached to surface 25 using threaded fasteners (not shown).

Orientation stage 10 is configured to control movement of template 22 and place the same in a desired spatial relationship with respect to a reference surface (not shown). To that end, plurality of actuators 40, 42, and 44 are connected between outer frame 14 and inner frame 12 so as to be spaced about orientation stage 10. Each of actuators 40, 42, and 44 has a first end 46 and a second end 48. First end 46 of actuator 40 faces outer frame 14, and second end 48 faces inner frame 12. Actuators 40, 42, and 44 tilt inner frame 12 with respect to outer frame 14 by facilitating translational motion of inner frame 12 along three axes $Z_1$, $Z_2$, and $Z_3$. Orientation stage 10 may provide a range of motion of approximately ±1.2 mm about axes $Z_1$, $Z_2$, and $Z_3$. In this fashion, actuators 40, 42, and 44 cause inner frame 12 to impart angular motion to compliant device 18 and, therefore, template 22 and template chuck 20, about one or more of a plurality of axes $T_1$, $T_2$ and $T_3$. Specifically, by decreasing a distance between inner frame 12 and outer frame 14 along axes $Z_2$ and $Z_3$ and increasing a distance therebetween along axis $Z_1$, angular motion about tilt axis $T_2$ occurs in a first direction. Increasing the distance between inner frame 12 and outer frame 14 along axes $Z_2$ and $Z_3$ and decreasing the distance therebetween along axis $Z_1$, angular motion about tilt axis $T_2$ occurs in a second direction opposite to the first direction. In a similar manner angular movement about axis $T_1$ may occur by varying the distance between inner frame 12 and outer frame 14 by movement of inner frame 12 along axes $Z_1$ and $Z_2$ in the same direction and magnitude while moving of the inner frame 12 along axis $Z_3$ in a direction opposite and twice to the movement along axes $Z_1$ and $Z_2$. Similarly, angular movement about axis $T_3$ may occur by varying the distance between inner frame 12 and outer frame 14 by movement of inner frame 12 along axes $Z_1$ and $Z_3$ in the same direction and magnitude while moving inner frame 12 along axis 22 $Z_o$ in direction opposite and twice to the movement along axes $Z_1$ and $Z_3$. Actuators 40, 42, and 44 may have a maximum operational force of ±200 N. Orientation stage 10 may provide a range of motion of approximately ±0-15° about axes $T_1$, $T_2$, and $T_3$.

Actuators 40, 42, and 44 are selected to minimize mechanical parts and, therefore, minimize uneven mechanical compliance, as well as friction, which may cause particulates. Examples of actuators 40, 42, and 44 include voice coil actuators, piezo actuators, and linear actuators. An exemplary embodiment for actuators 40, 42, and 44 is available from BEI Technologies of Sylmar, California under the trade name LA24-20-000A. Additionally, actuators 40, 42, and 44 are coupled between inner frame 12 and outer frame 14 so as to be symmetrically disposed thereabout and lie outside of central throughway 24 and central opening 26. With this configuration an unobstructed throughway between outer frame 14 to compliant device 18 is configured. Additionally, the symmetrical arrangement minimizes dynamic vibration and uneven thermal drift, thereby providing fine-motion correction of inner frame 12.

The combination of the inner frame 12, outer frame 14, flexure ring 16 and actuators 40, 42, and 44 provides angular motion of compliant device 18 and, therefore, template chuck 20 and template 22 about tilt axes $T_1$, $T_2$ and $T_3$. It is desired, however, that translational motion be imparted to template 22 along axes that lie in a plane extending transversely, if not orthogonally, to axes $Z_1$, $Z_2$, and $Z_3$. This is achieved by providing compliant device 18 with a functionality to impart angular motion upon template 22 about one or more of a plurality of compliance axes, shown as $C_1$ and $C_2$, which are spaced-part from tilt axes $T_1$, $T_2$ and $T_3$ and exist on the surface of the template when the template, the template chuck, and the compliant device are assembled.

Figure 3:
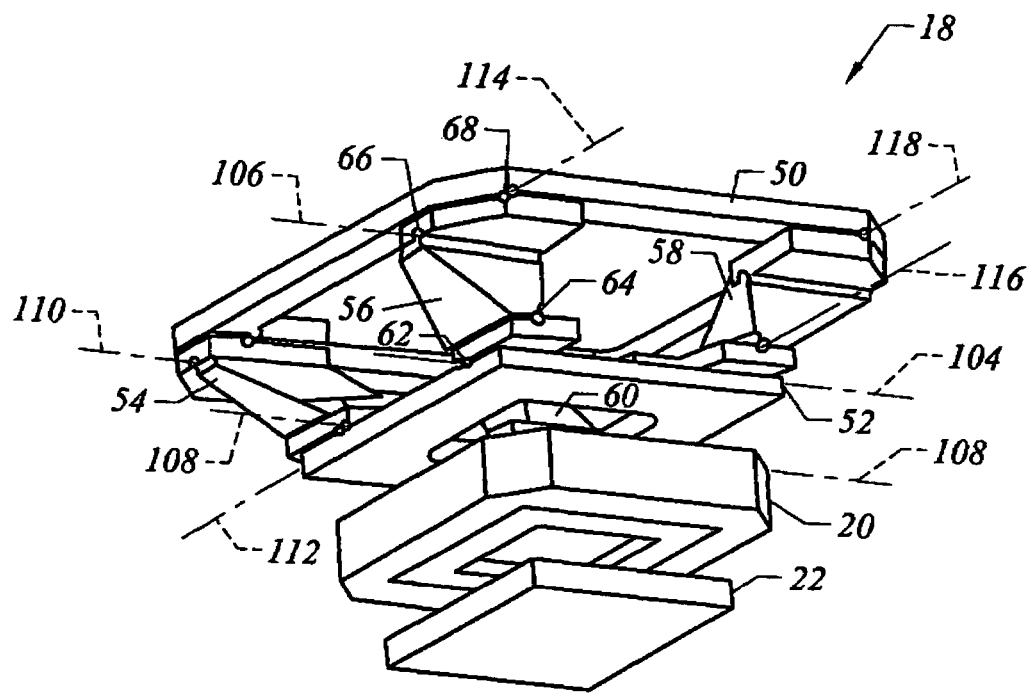
FIG. 3 is an exploded perspective view of a passive compliant device included in the orientation stage shown in FIG. 1 along with the template holder and the template in accordance with a first embodiment of the present invention.
Figure 4:
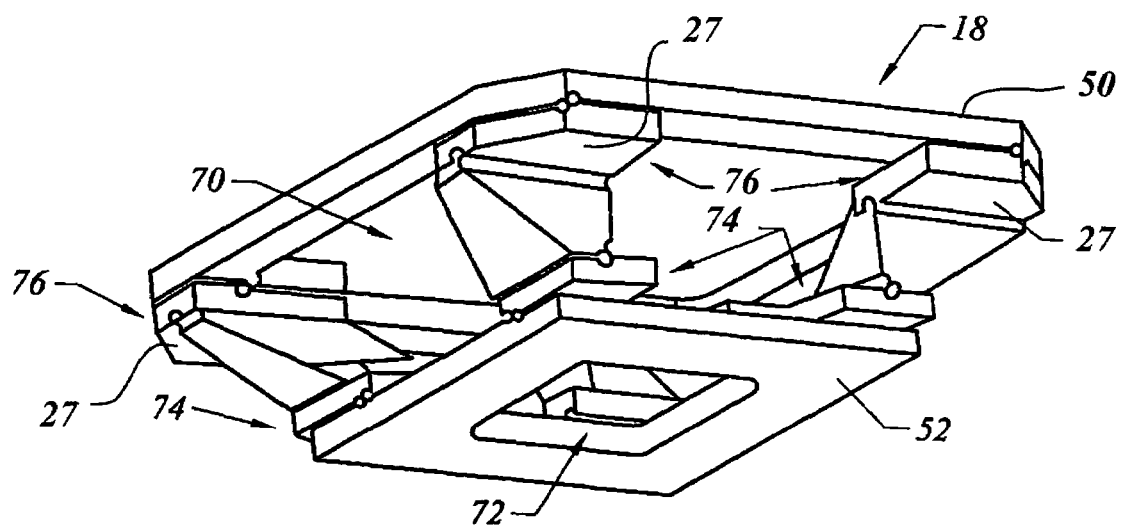
FIG. 4 is a detailed perspective view of the passive compliant device shown in FIG. 3.

Referring to FIGS. 3 and 4, compliant device 18 includes a support body 50 and a floating body 52 that is coupled to the support body 50 vis-a-vis a plurality of flexure arms 54, 56, 58, and 60. Template chuck 20 is intended to be mounted to floating body 52 via conventional fastening means, and template 22 is retained by template chuck 20 using conventional methods.

Each of flexure arms 54, 56, 58, and 60 includes first and second sets of flexure joints 62, 64, 66, and 68. The first and second sets of flexure joints 62, 64, 66, and 68 are discussed with respect to flexure arm 56 for ease of discussion, but this discussion applies equally to the sets of flexure joints associated with flexure arms 56, 58, and 60. Although it is not necessary, compliant device 18 is formed from a solid body, for example, stainless steel. As a result, support body 50, floating body 52 and flexure arms 54, 56, 58, and 60 are integrally formed and are rotationally coupled together vis-a-vis first and second sets of flexure joints 62, 64, 66, and 68. Support body 50 includes a centrally disposed throughway 70. Floating body 52 includes a centrally disposed aperture 72 that is in superimposition with throughway 70. Each flexure arm 54, 56, 58, and 60 includes opposed ends, 74 and 76. End 74 of each flexure arm 54, 56, 58, and 60 is connected to support body 50 through flexure joints 66 and 68. End 74 lies outside of throughway 70. End 76 of each flexure arm 54, 56, 58, and 60 is connected to floating body 52 through flexure joints 62 and 64. End 76 lies outside of aperture 72.

Figure 5:
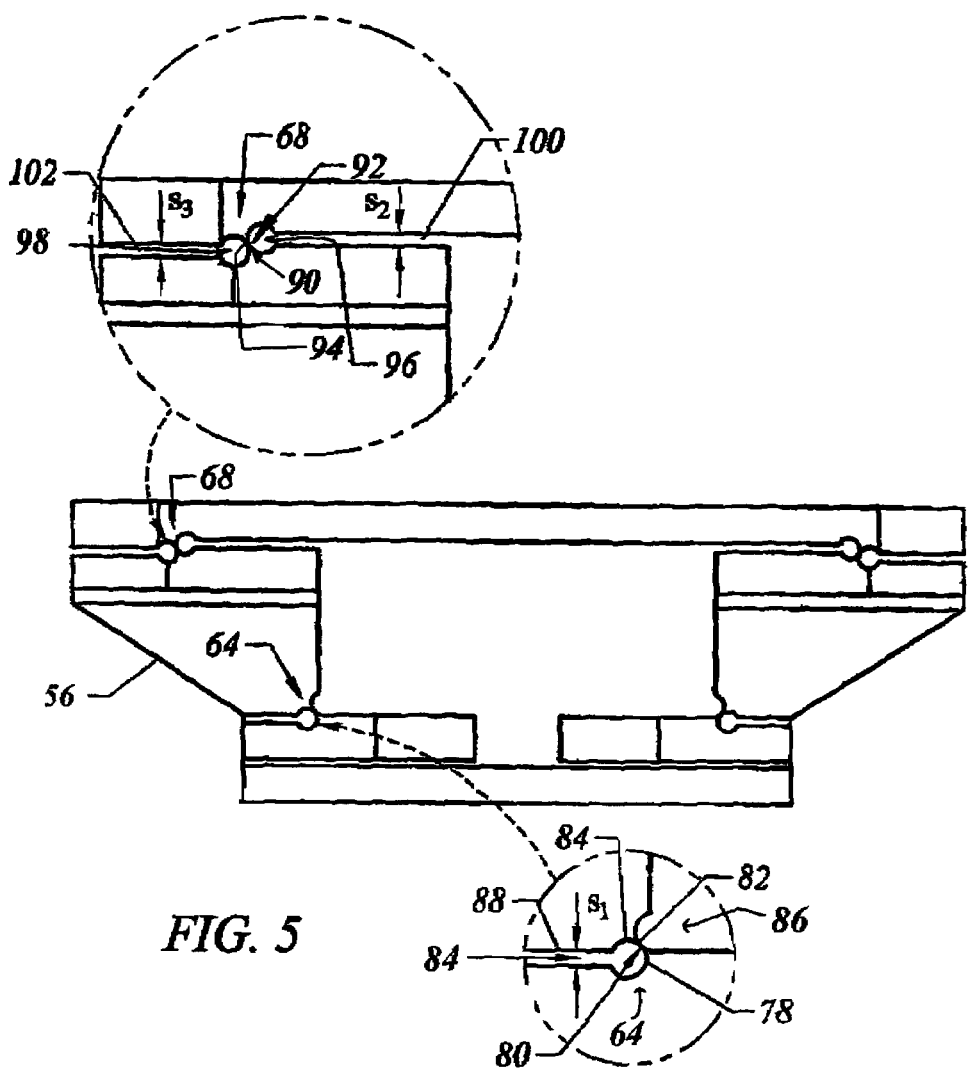
FIG. 5 is a side view of the passive, compliant device shown in FIG. 4, showing detail of flexure joints included therewith.

Referring to FIGS. 4 and 5, each of joints 62, 64, 66, and 68 are formed by reducing material from device 18 proximate to ends 74 and 76, i.e., at an interface either of support body 50 or floating body 52 and one of flexure arms 54, 56, 58, and 60. To that end, flexure joints 62, 64, 66, and 68 are formed by machining, laser cutting or other suitable processing of device 18. Specifically, joints 64 and 66 are formed from a flexure member 78 having two opposing surfaces 80 and 82. Each of surfaces 80 and 82 includes hiatus 84 and 86, respectively. Hiatus 84 is positioned facing away from hiatus 86, and hiatus 86 faces away from hiatus 84. Extending from hiatus 86, away from surface 80 is a gap 88, terminating in an opening in a periphery of flexure arm 56. Joints 62 and 68 are also formed from a flexure member 90 having two opposing surfaces 92 and 94. Each of surfaces 92 and 94 includes a hiatus 96 and 98, respectively. Hiatus 98 is positioned facing surface 92, and hiatus 98 faces away from surface 94. Extending from hiatus 98, away from surface 92 is a gap 100, and extending from hiatus 98 is a gap 102. The spacing S1, S2 and S3 of gaps 88, 100, and 102, respectively define a range of motion over which relative movement between either of support body 50 and floating body 52 may occur.

Referring to FIGS. 3 and 5, flexure member 90 associated with joints 62 of flexure arms 56 and 58 facilitates rotation about axis 104, and flexure member 78 associated with joints 66 of flexure arms 56 and 58 facilitates rotation about axis 106. Flexure member 90 associated with joints 62 of flexure arms 54 and 60 facilitates rotation about axis 108, and flexure member 78 associated with joints 66 of flexure arms 54 and 60 facilitates rotation about axis 110. Flexure member 78 associated with joints 64 of flexure arms 54 and 56 facilitates rotation about axis 112, and flexure member 90 associated with joints 68 of flexure arms 54 and 56 facilitates rotation about axis 114. Flexure member 78 associated with joints 64 of flexure arms 58 and 60 facilitates rotation about axis 116, and flexure member 90 associated with joints 68 of flexure arms 58 and 60 facilitates rotation about axis 118.

As a result, each flexure arm 54, 56, 58, and 60 is located at a region of said device 18 where groups of the axes of rotation overlap. For example, end 74 of flexure arm 54 is located where axes 110 and 114 overlap and end 76 is positioned where axes 108 and 112 overlap. End 74 of flexure arm 56 is located where axes 106 and 114 overlap, and end 76 is positioned where axes 110 and 112 overlap. End 74 of flexure arm 58 is located where axes 106 and 118 overlap, and end 76 is located where axes 104 and 116 overlap. Similarly, end 74 of flexure arm 60 is located where axes 110 and 118 overlap, and end 76 is located where 108 and 116 overlap.

As a result of this configuration, each flexure arm 54, 56, 58, and 60 is coupled to provide relative rotational movement with respect to support body 50 and floating body 52 about two groups of overlapping axes with a first group extending transversely to the remaining group. This provides each of flexure arms 54, 56, 58, and 60 with movement about two groups of orthogonal axes while minimizing the footprint of the same. Device 18 may provide a tilting motion range of approximately ±0.040°, an active tilting motion range of approximately ±0.020°, and an active theta motion range of approximately ±0.00050° above the above mentioned axes. Furthermore, having the reduced footprint of each flexure arm 54, 56, 58, and 60 allows leaving a void 120 between throughway 70 and aperture 72 unobstructed by flexure arms 54, 56, 58, and 60. This makes device 18 suited for use with an imprint lithography system, discussed more fully below.

Figures 6, 7:
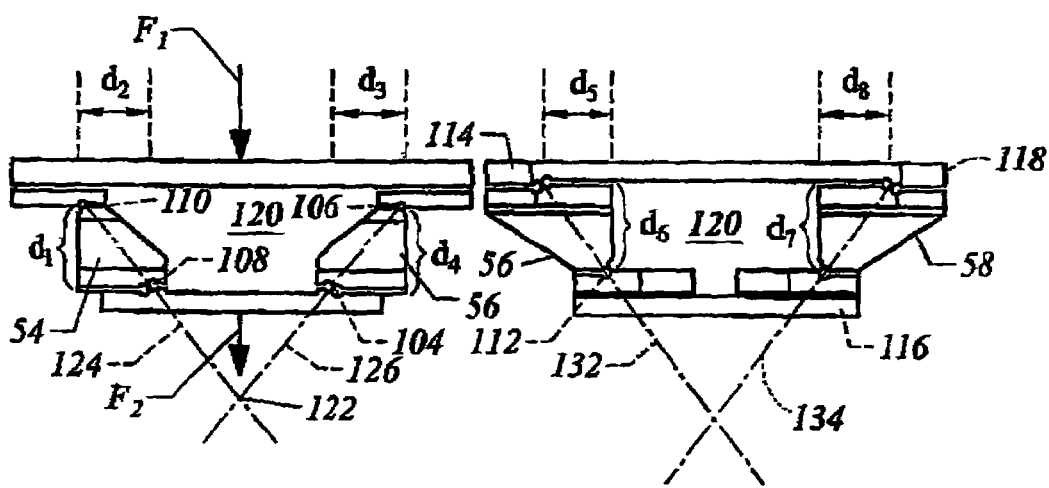
FIG. 6 is a side view of the passive compliant device shown in FIG. 4.
FIG. 7 is a side view of the compliant device, shown in FIG. 6, rotated 90 degrees.

Referring to FIGS. 4, 6 and 7, the present configuration of flexure arms 54, 56, 58, and 60 with respect to support body 50 and floating body 52 facilitates parallel transfer of loads in device 18. For example, were a load force imparted upon support body 50, each flexures arm 54, 56, 58, and 60 would impart substantially equal amount of force $F_1$ upon floating body 52. Among other things, this facilitates obtaining a desired structural stiffness with device 18 when loaded with either a force $F_1$ or a force $F_2$. To that end, joints 62, 64, 66, and 68 are resolute joints which minimize movement, in all directions, between the flexure arms 54, 56, 58, and 60, and either support body 50 or floating body 52 excepting rotational movement. Specifically, joints 62, 64, 66, and 68 minimize translational movement between flexure arms 54, 56, 58, and 60, support body 50 and floating body 52, while facilitating rotational movement about axes 104, 106, 108, 110, 112, 114, 116, and 118.

Referring to FIGS. 4, 5, 6, and 7, the relative position of axes 104, 106, 108, and 110 provides floating body 52 with a first remote center of compliance (RCC) at a position 122 spaced-apart from floating body 52, centered with respect to aperture 72 and equidistant from each axis 104, 106, 108, and 110. Similarly, the relative position of axes 112, 114, 116, and 118 provides floating body 52 with a second RCC substantially close to position 122 and desirably located at position 122. Each axis 112, 114, 116, and 118 is positioned equidistant from position 122. Each axis of the group of axes 104, 106, 108, and 110 extends parallel to the remaining axes 104, 106, 108, and 110 of the group. Similarly, each axis of the group of axes 104, 106, 108, and 110 extends parallel to the remaining axes 104, 106, 108, and 110 of the group and orthogonally to each axis 104, 106, 108, and 110. Axis 110 is spaced-apart from axis 108 along a first direction a distance $d_1$ and along a second orthogonal direction a distance $d_2$. Axis 104 is spaced-apart from axis 106 along the first direction a distance $d_3$ and along the second direction a distance $d_4$. Axis 112 is spaced-apart from axis 114 along a third direction, that is orthogonal to both the first and second directions a distance $d_5$ and along the second direction a distance $d_6$. Axis 116 is spaced-apart from axis 118 along the second direction a distance $d_7$ and along the third direction a distance $d_8$. Distances $d_1$, $d_4$, $d_6$ and $d_7$ are substantially equal. Distances $d_2$, $d_3$, $d_5$ and $d_8$ are substantially equal.

Two sets of transversely extending axes may be in substantially close proximity such that RCC 122 may be considered to lie upon an intersection thereat by appropriately establishing distances $d_1$-$d_8$. A first set includes four axes shown as 124, 126, 128, and 130. Joints 62 and 66 of flexure arm 54 lie along axis 124, and joints 62 and 66 of flexure arm 56 lie along axis 126. Joints 62 and 66 of flexure arm 58 lie along axis 128, and joints 62 and 66 of flexure arm 60 lie along axis 130. A second set of four axes is shown as 132, 134, 136, and 138. Joints 64 and 68 of flexure arm 56 lie along axis 132, and joints 64 and 68 of flexure arm 58 lie along axis 134. Joints 64 and 68 of flexure arm 60 lie along axis 136, and joints 64 and 68 of flexure arm 54 lie along axis 138. With this configuration movement of floating body 52, with respect to RCC 122, about any one of the set of axes 124, 126, 128, 130, 132, 134, 136, and 138 is decoupled from movement about the remaining axes 124, 126, 128, 130, 132, 134, 136, and 138. This provides a gimbal-like movement of floating body 52 with respect to RCC 122, with the structural stiffness to resist, if not prevent, translational movement of floating body 52 with respect to axis 124, 126, 128, 130, 132, 134, 136, and 138.

Figure 10:
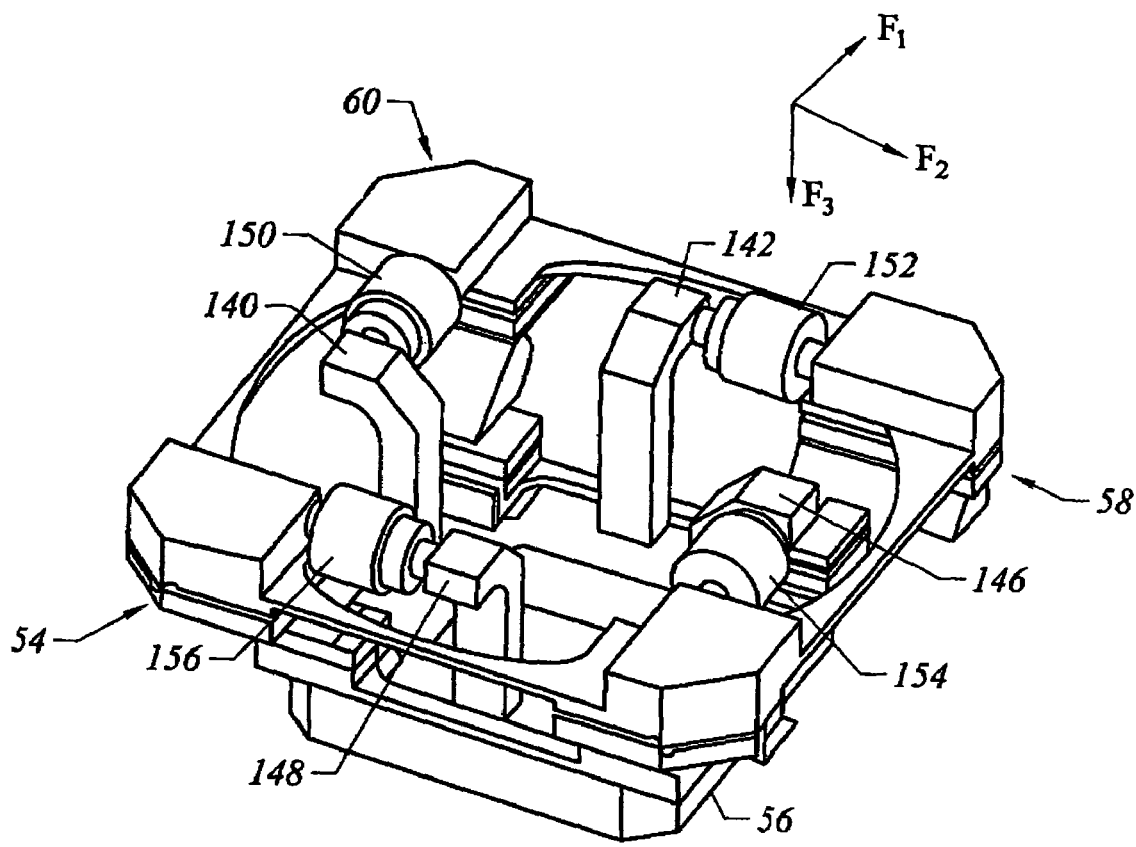
FIG. 10 is a perspective view of a compliant device in accordance with an alternate embodiment of the present invention.

Referring to FIGS. 4 and 10, in accordance with an alternate embodiment of the present invention, device 18 may be provided with active compliance functionality shown with device 18. To that end, a plurality of lever arms 140, 142, 146, and 148 are coupled to floating body 52 and extend toward support body 50 terminating proximate to a piston of an actuator. As shown lever arm 140 has one end positioned proximate to the piston of actuator 150, lever arm 142 has one end positioned proximate to the piston of actuator 152, lever arm 146 has one end positioned proximate to the piston of actuator 154 and one end of actuator arm 118 is positioned proximate to the piston of actuator 156 that is coupled thereto. By activating the proper sets of actuators 150, 152, 154, and 156, angular positioning of the relative position of floating body 52 with respect to support body 50 may be achieved. An exemplary embodiment for actuators 150, 152, 154, and 156 is available from BEI Technologies of Sylmar, Calif. under the trade name LA10-12-027A.

To provide rotational movement of floating body 52 with respect to support body 50, actuators 150, 152, 154, and 156 may be activated. For example, actuator 150 may be activated to move lever arm 140 along the $F_1$ direction and actuator 154 would be operated to move lever arm 146 in a direction opposite to the direction lever arm 140 moves. Similarly, at least one of actuators 152 and 156 are activated to move lever arms 142 and 148 respectively. Assuming both actuators 152 and 156 are activated, then each of lever arms 140, 142, 146, and 148 are moved toward one of flexure arms 54, 56, 58, and 60 that differs from the flexure arm 54, 56, 58, and 60 toward which the remaining lever arms 140, 142, 146, and 148 move. An example may include moving lever arm 140 toward flexure arm 54, lever arm 142 toward flexure arm 56, lever arm 146 toward flexure arm 58 and lever arm 142 toward flexure arm 60. This would impart rotational movement about the $F_3$ direction. It should be understood, however, that each of lever arms 140, 142, 146, and 148 may be moved in the opposite direction. Were it desired to prevent translational displacement between support body 50 and floating body 52 along the $F_3$ direction while imparting rotational movement thereabout, then each of lever arms 140, 142, 146, and 148 would be moved the same magnitude. However, were it desired to impart rotational movement of floating body 52 about the $F_1$ and $F_2$ directions, this might be achieved in various manners.

Since rotational movement of floating body 52 is guided by the first and second RCCs, floating body 52 can be actively adjusted for two independent angular configurations with respect to support body 50 by translation along the $F_3$ direction. For example, moving each of lever arms 140, 142, 146, and 148 with actuators 150, 152, 154, and 156, respectively, differing amounts would impart translation of floating body 52 along the $F_3$ direction while imparting angular displacement about the $F_3$ direction. Additionally, moving only three lever arms 140, 142, 146, and 148 would also impart translation motion about the $F_3$ direction while imparting angular displacement about the $F_3$ direction. Were it desired to provide impart translational motion between support body 50 and floating body 52 without impart rotational movement therebetween, two of actuators 150, 152, 154, and 156 would be activated to move two of lever arms 140, 142, 146, and 148. In one example, two opposing lever arms, such as for example, 140 and 146, or 142 and 148 would be moved in the same direction the same magnitude. Moving lever arms 140 and 146 in one direction, e.g., toward flexure arms 60 and 58, respectively, would cause the entire side of floating body 52 extending between flexure arms 58 and 60 to increase in distance from the side of support body 50 in superimposition therewith, effectively creating rotation movement of floating body 16 about the $F_2$ direction. Decrease would the distance between the side of floating body, 52, extending between flexure arms 56 and 54, and the side of support body 50 in superimposition therewith. Conversely, moving lever arias 140 and 146 in an opposite direction, e.g., toward flexure arms 54 and 56, would cause the entire side of floating body 52 extending between flexure arms 58 and 60 to decrease in distance from the side of support body 50. The distance between the side of floating body 52 extending between flexure arms 58 and 60 and the side of support body 50 in superimposition therewith would increase. Similarly, rotational movement of floating body 52 about the $F_1$ direction may be achieved by movement of lever arms 142 and 148 with actuators 152 and 156, respectively, as discussed above with respect to movement of lever arms 140 and 146. It should be understood that any linear combination of movement of the aforementioned lever arms may be effectuated to achieve desired motion.

From the foregoing it is seen that rotational motions of floating body 52 about the $F_1$, $F_2$ and $F_3$ directions are orthogonal to each other. By adjusting the magnitude of each actuation force or position at actuators 150, 152, 154 and 156, any combination or rotational motions about the $F_1$, $F_2$ and $F_3$ directions are constrained by the structural stiffness of flexure arms 54, 56, 58, and 60, floating body 52 and support body 50.

Figure 11:
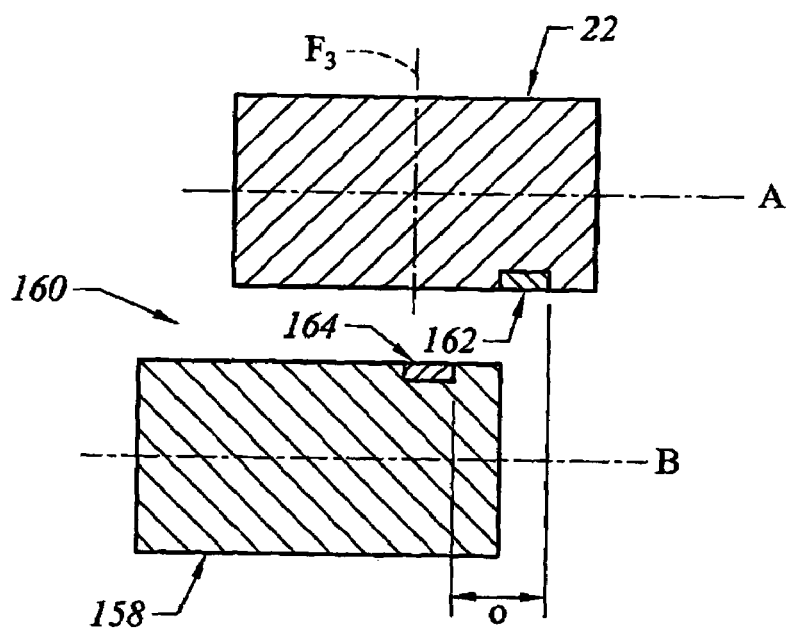
FIG. 11 is a simplified elevation view of the template, shown in FIG. 1, in superimposition with a substrate showing misalignment along one direction.
Figure 12:
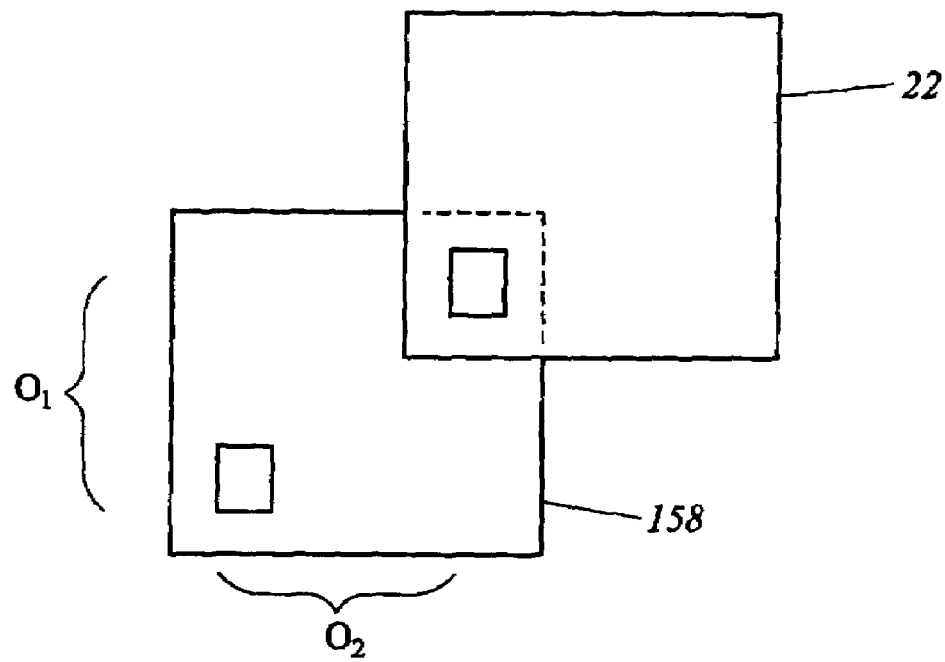
FIG. 12 is a top-down view of the template and substrate, shown in FIG. 11, showing misalignment along two transverse directions.

Referring to FIGS. 1, 11 and 12, in operation, orientation stage 10 is typically employed with an imprint lithography system (not shown). An exemplary lithographic system is available under the trade name IMPRIO™250 from Molecular Imprints, Inc. havin a place of business at 1807-C Braker Lane, Suite 100, Austin, Texas 78758. The system description for the IMPRIO 100™ is available at www.moecularimprints.com and is incorporated herein by reference. As a result, orientation stage 10 may be employed to facilitate alignment of template 22 with a surface in superimposition therewith, such as a surface of substrate 158. As a result, the surface of substrate 158 may be comprised of the material from which substrate 158 is formed, .g., silicon with a native oxide present, or may consist of a patterned or unpatterned layer of, for example, conductive material, dielectric material and the like.

Template 22 and substrate 158 are shown spaced-apart a distance defining a gap 160 therebetween. The volume associated with gap 160 is dependent upon many factors, including the topography of the surface of template 22 facing substrate 158 and the surface of substrate 158 facing template 22, as well as the angular relationship between a neutral axis A of substrate 158 with respect to the neutral axis B of substrate 158. In addition, were the topography of both of the aforementioned surfaces patterned, the volume associated with gap 160 would also be dependent upon the angular relation between template 22 and substrate 158 about axis Z. Considering that desirable patterning with imprint lithography techniques is, in large part, dependent upon providing the appropriate volume to gap 160, it is desirable to accurately align template 22 and substrate 158. To that end, template 22 includes template alignment marks, one of which is shown as 162, and substrate 158 includes substrate alignment marks, one of which is shown as 164.

Figure 13:
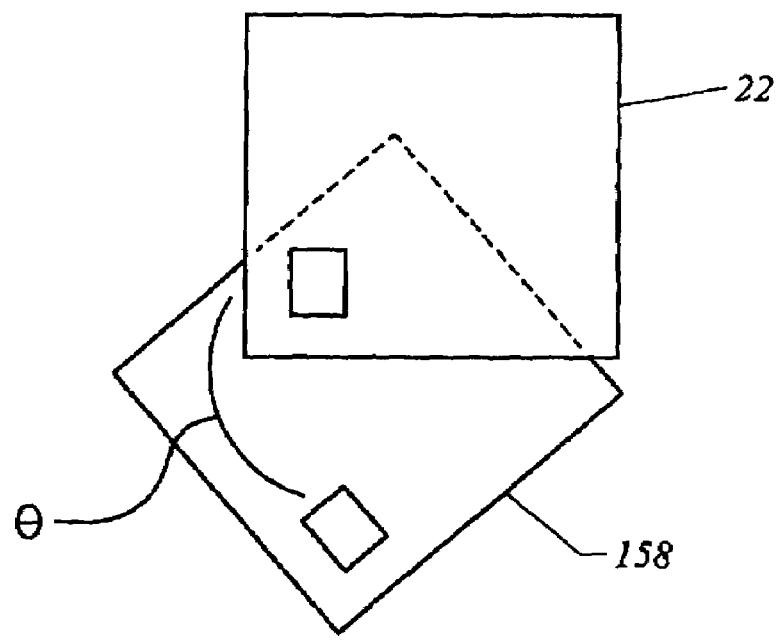
Fig 13. is a top-down view of the template and substrate, shown in FIG. 11, showing angular misalignment.

In the present example it is assumed that desired alignment between template 22 and substrate 158 occurs upon template alignment mark 162 being in superimposition with substrate alignment mark 164. As shown, desired alignment between template 22 and substrate 158 has not occurred, shown by the two marks offset, a distance O. Further, although offset O is shown as being a linear offset in one direction, it should be understood that the offset may be linear along two directions shown as $O_1$ and $O_2$. In addition to, or instead of, the aforementioned linear offset in one or two directions, the offset between template 22 and substrate 158 may also consist of an angular offset, shown in FIG. 13 as angle θ.

Figure 14:
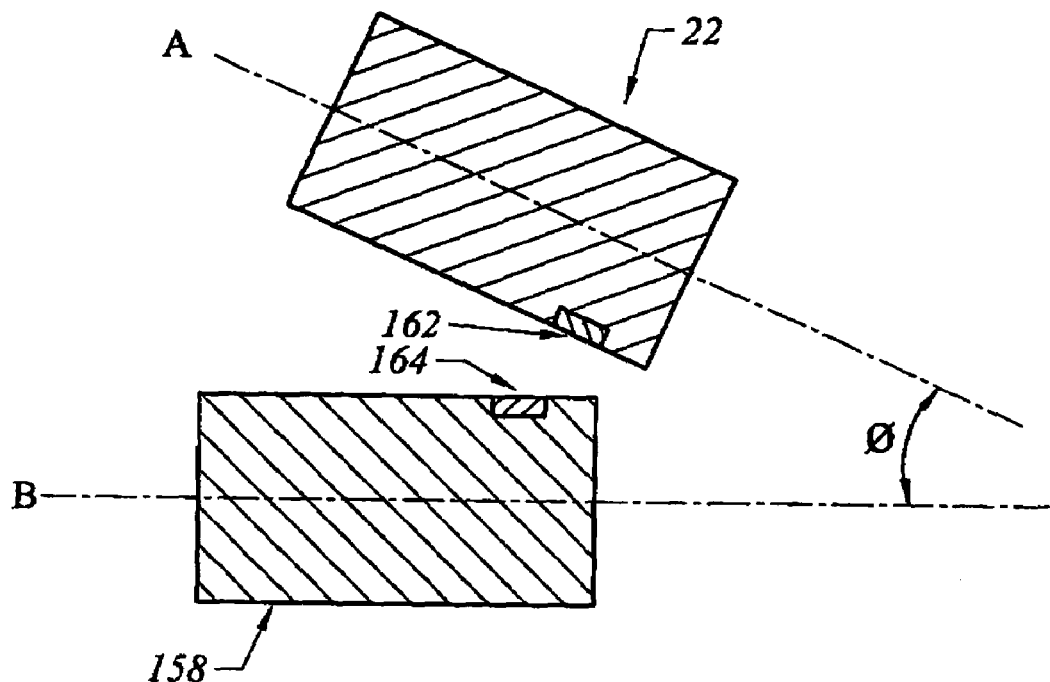
FIG. 14 is a simplified elevation view of the template, shown in FIG. 1, in superimposition with a substrate showing angular misalignment.

Referring to FIGS. 2, 10, and 14, desired alignment between template 22 and substrate 158 is obtained by the combined rotational movement about one or more axes $T_1$, $T_2$, $T_3$, $F_1$, $F_2$ and $F_3$. Specifically, to attenuate offset linear offset, movement, as a unit, of compliant device 18, template chuck 20 and template 22 about one or more axes $T_1$, $T_2$, $T_3$ is undertaken. This typically results in an oblique angle φ being produced between neutral axes A and B. Thereafter, angular movement of template 22 about one or more of axes $F_1$ and $F_2$ are undertaken to compensate for the angle φ and ensure that neutral axis A extends parallel to neutral axis B.

Figure 15:
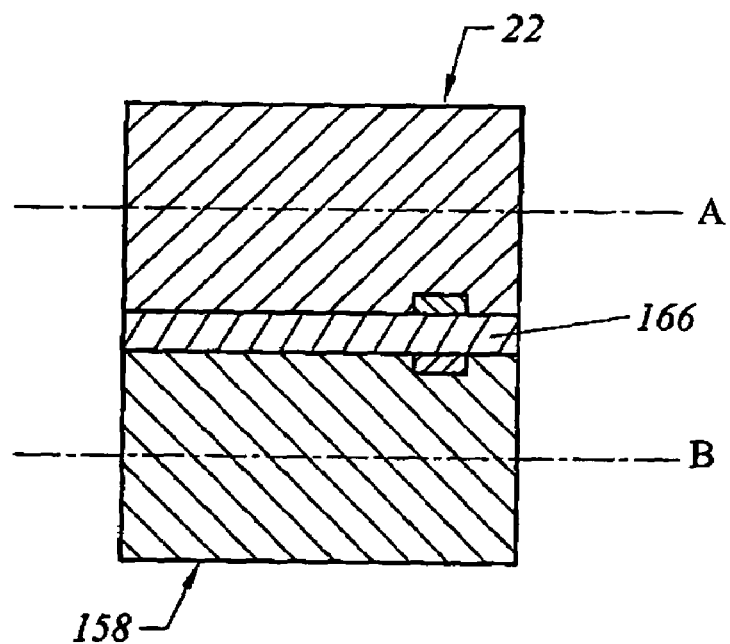
FIG. 15 is a simplified elevation view showing desired alignment between the template and substrate shown in FIGS. 11, 12, 13 and 14.

Furthermore, the combined angular movement about axes $T_1$, $T_2$, $T_3$, $F_1$, $F_2$ results in a swinging motion of template 22 to effectuate movement of the same in a plane extending parallel to neutral axis B and transverse, if not orthogonal, to axes $Z_1$, $Z_2$ and $Z_3$. In this manner, template 22 may be properly aligned with respect to substrate 158 along linear axes lying in a plane extending parallel to neutral axis B, shown in FIG. 15. Were it desired to attenuate, if not abrogate, angular offset, template 22 would be rotated about axis F3 by use of actuators 150, 152, 154, and 156 to provide the desired alignment.

Referring to FIGS. 2, 10, and 14, desired alignment between template 22 and substrate 158 is obtained by the combined rotational movement about one or more axes $T_1$, $T_2$, $T_3$, $F_1$, $F_2$ and $F_3$. Specifically, to attenuate offset linear offset, movement, as a unit, of compliant device 18, template chuck 20 and template 22 about one or more axes $T_1$, $T_2$, $T_3$ is undertaken. This typically results in an oblique angle φ being produced between neutral axes A and B. Thereafter, angular movement of template 22 about one or more of axes $F_1$ and $F_2$ are undertaken to compensate for the angle φ and ensure that neutral axis A extends parallel to neutral axis B. Furthermore, the combined angular movement about axes $T_1$, $T_2$, $T_3$, $F_1$, $F_2$ results in a swinging motion of template 22 to effectuate movement of the same in a plane extending parallel to neutral axis B and transverse, of not orthogonal, to axes $Z_1$, $Z_2$ and $Z_3$. In this manner, template 22 may be properly aligned with respect to substrate 158 along to linear axes lying in a plane extending parallel to neutral axis B, shown in FIG. 15. Were it desired to attenuate, of not abrogate, angular offset, template 22 would be rotated about axis F3 by use of actuators 150, 152, 154, and 156 to provide the desired alignment.

After the desired alignment has occurred, actuators 40, 42, and 44 are operated to move template 22 into contact with a surface proximate to substrate. In the present example the surface consists of polymerizable imprinting material 166 disposed on substrate 158. It should be noted that actuators 40, 42, and 44 are operated to minimize changes in the angle formed between neutral axes A and B once desired alignment has been obtained. It should be known, however, that it is not necessary for neutral axes A and B to extend exactly parallel to one another, so long as the angular deviation from parallelism is within the compliance tolerance of compliant device 18, as defined by flexure joints 62, 64, 66, and 68 and flexure arms 54, 56, 58, and 60. In this fashion, neutral axes A and B may be orientated to be as parallel as possible in order to maximize the resolution of pattern formation into polyrnerizable material. As a result, it is desired that position 122 at which the first and second RCCs are situation be placed at the interface of template 22 and material polymerizable imprinting material 166.

Figure 16:
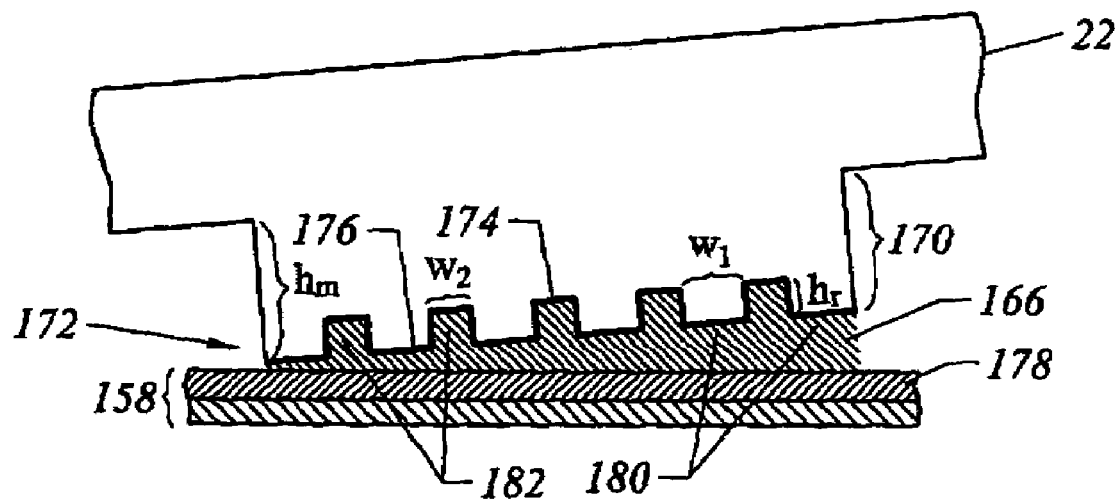
FIG. 16 is a detailed view of one embodiment of the template shown in FIGS. 1, 3, 11, 12, 13, 14 and 15 in superimposition with a substrate.
Figure 17:
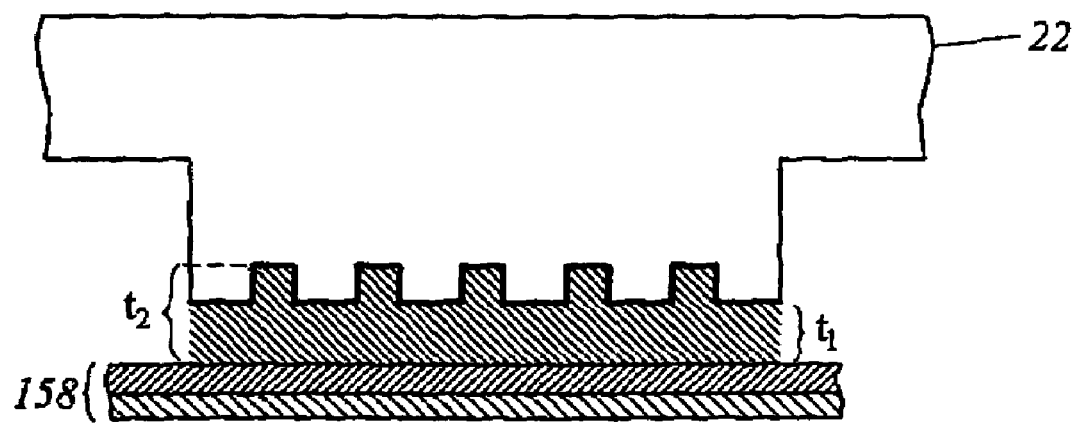
FIG. 17 is a detailed view of the template shown in FIG. 16 showing a desired spatial arrangement with respect to the substrate.

Referring to FIGS. 1, 16 and 17, as discussed above, the foregoing system 10 is useful for patterning substrates, such as substrate 158, employing imprint lithography techniques. To that end, template 22 typically includes a mesa 170 having a pattern recorded in a surface thereof, defining a mold 172. An exemplary template 22 is shown in U.S. Pat. No. 6,696,220, which is incorporated by reference herein. The pattern on mold 172 may be comprised of a smooth surface of a plurality of features, as shown, formed by a plurality of spaced-apart recesses 174 and projections 176. Projections 30 have a width $W_1$, and recesses 28 have a width $W_2$. The plurality of features defines an original pattern that forms the basis of a pattern to be transferred into a substrate 158.

Referring to FIGS. 16 and 17 the pattern recorded in material 166 is produced, in part, by mechanical contact of the material 166 with mold 172 and substrate 158, which as shown, may include an existing layer thereon, such as a transfer layer 178. An exemplary embodiment for transfer layer 178 is available from Brewer Science, Inc. of Rolla, Mo. under the trade name DUV30J-6. It should be understood that material 166 and transfer layer 178 may be deposited using any known technique, including drop dispense and spin-coating techniques.

Upon contact with material 166, it is desired that portion 180 of material 166 in superimposition with projections 30 remain having a thickness $t_1$, and sub-portions 182 remain having a thickness $t_2$. Thickness $t_1$ is referred to as a residual thickness. Thicknesses "$t_1$" and "$t_2$" may be any thickness desired, dependent upon the application. Thickness $t_1$ and $t_2$ may have a value in the range of 10 nm to 10 μm. The total volume contained within material 166 may be such so as to minimize, or to avoid, a quantity of material 166 from extending beyond the region of substrate 158 not in superimposition with mold 172, while obtaining desired thicknesses $t_1$ and $t_2$. To that end, mesa 170 is provided with a height, $h_m$, which is substantially greater than a depth of recesses 174, $h_r$. In this manner, capillary forces of material 166 with substrate 158 and mold 172 restrict movement of material 166 from extending beyond regions of substrate 158 not in superimposition with mold 172, upon $t_1$ and $t_2$ reaching a desired thickness.

A benefit provided by system 10 is that it facilitates precise control over thicknesses $t_1$ and $t_2$. Specifically, it is desired to have each of thicknesses $t_1$ be substantially equal and that each of thicknesses $t_2$ be substantially equal. As shown in FIG. 16, thicknesses $t_1$ are not uniform, as neither are thickness $t_2$. This is an undesirable orientation of mold 172 with respect to substrate 158. With the present system 10, uniform thickness $t_1$ and $t_2$ may be obtained, shown in FIG. 17. As a result, precise control over thickness $t_1$ and $t_2$ may be obtained, which is highly desirable. In the present invention, system 10 provide a three sigma alignment accuracy having a minimum feature size of, for example, about 50 nm or less.

The embodiments of the present invention described above are exemplary. As a result, many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A compliant device, comprising:
   a support body;
   a floating body; and
   a plurality of flexure arms coupled between said support body and said floating body to allow rotational movement between said support body and said floating body about a plurality of axes, wherein a first end of each of said plurality of flexure arms is coupled to said support body where a first pair of said plurality of axes overlap, and a second end of each of said plurality of flexure arms are coupled to said floating body where a second pair of said plurality of axes overlap.

2. The compliant device as recited in claim 1 wherein a subset of said plurality of flexure arms each has a first set and a second set of flexure joints, with said first set of flexure joints facilitating rotational movement about said first pair of said plurality of axes extending along a first direction and said second set of flexure joints facilitating rotational movement of said flexure arm about said second pair of said plurality of axes extending along a second direction, transversely to said first direction.

3. The device as recited in claim 1 wherein said plurality of flexure members are coupled between said support body and said floating body to facilitate relative rotational movement between said floating body and said support body about two transversely extending axes intersecting at a point.

4. The device as recited in claim 1 wherein said plurality of flexure members are coupled between said support body and said floating body to facilitate relative rotational movement between said floating body and said support body about two transversely extending axes intersecting at a point, with movement of about one of said two transversely extending axes being decoupled from movement about the remaining of axis of said two transversely extending axes.

5. The device as recited in claim 1 wherein said plurality of flexure members are coupled between said support body and said floating body to facilitate relative rotational movement between said floating body and said support body about two transversely extending axes intersecting at a point, while minimizing relative translational movement between said support body and said floating body.

6. The compliant device as recited in claim 1 wherein a subset of said plurality of flexure arms each has two sets of resolute joints arranged to facilitate rotational movement of said flexure arm about two transverse axes.

7. The compliant device as recited in claim 1 wherein said support body, said floating body and said plurality of flexure arms are integrally formed.

8. The compliant device as recited in claim 1 wherein said plurality of flexure arms are coupled so that all loads transferred between said support body and said floating body occurs in parallel.

9. The compliant device as recited in claim 1 wherein said floating body includes an aperture with one end of each of said flexure arms being coupled to said floating body, outside of said aperture.

10. The compliant device as recited in claim 1 wherein said floating body includes an aperture and said support body includes a throughway in superimposition with said aperture, with a first end of each of said flexure arms being coupled to said floating body, outside of said aperture and a second end of each of said plurality of flexure arms being coupled to said support body outside of said throughway.

11. The compliant device as recited in claim 1 further including an actuator system coupled to facilitate angular and translational movement between said support body and said floating body.

* * * * *

UNITED STATES PATENT AND TRADEMARK OFFICE
CERTIFICATE OF CORRECTION

PATENT NO. : 7,387,508 B2  Page 1 of 1
APPLICATION NO. : 11/142838
DATED : June 17, 2008
INVENTOR(S) : Choi et al.

It is certified that error appears in the above-identified patent and that said Letters Patent is hereby corrected as shown below:

Column 9, lines 11 to 32, should be deleted.

Signed and Sealed this

Twenty-third Day of June, 2009

JOHN DOLL
*Acting Director of the United States Patent and Trademark Office*